(12) United States Patent
Kim

(10) Patent No.: US 6,448,134 B2
(45) Date of Patent: Sep. 10, 2002

(54) METHOD FOR FABRICATING SEMICONDUCTOR DEVICE

(75) Inventor: Jae Kap Kim, Kyoungki-do (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 09/732,109

(22) Filed: Dec. 7, 2000

(30) Foreign Application Priority Data

Dec. 8, 1999 (KR) .............................. 99-55681

(51) Int. Cl.[7] .......................................... H01L 21/8242
(52) U.S. Cl. ...................................... 438/253; 438/396
(58) Field of Search ................................ 438/253, 254, 438/259, 266, 396, 386, 387, 239, 241, 250, 635, 672, 675

(56) References Cited

U.S. PATENT DOCUMENTS

| 5,300,814 A | * | 4/1994 | Matsumoto et al. ......... 257/758 |
| 5,488,007 A | * | 1/1996 | Kim et al. .................. 438/396 |
| 5,643,804 A | | 7/1997 | Arai et al. |
| 5,877,533 A | | 3/1999 | Arai et al. |
| 5,879,981 A | * | 3/1999 | Tanigawa .................... 438/241 |
| 5,962,886 A | | 10/1999 | Mori et al. |
| 6,025,620 A | | 2/2000 | Kimura et al. |
| 6,025,652 A | | 2/2000 | Tsukamoto |
| 6,069,786 A | | 5/2000 | Horie et al. |
| 6,100,193 A | | 8/2000 | Suehiro et al. |
| 6,281,540 B1 | * | 8/2001 | Aoki ........................... 257/306 |

* cited by examiner

Primary Examiner—David Nelms
Assistant Examiner—David Nhu
(74) Attorney, Agent, or Firm—Timothy J. Keefer; Wildman, Harrold, Allen & Dixon

(57) ABSTRACT

Disclosed is a method for fabricating a semiconductor device including stacked capacitors, in which dummy plate electrodes and charge storage electrodes are formed at a region other than a memory cell region, to control a topology resulting from capacitors, thereby allowing fine interconnection lines to be formed after the formation of those capacitors. In accordance with this method, dummy plate electrodes and charge storage electrodes, each of which has the same height as that of the stacked capacitor, are formed at the logic circuit region when the stacked capacitor are formed at the memory cell region.

7 Claims, 8 Drawing Sheets

METHOD FOR FABRICATING SEMICONDUCTOR DEVICE

CROSS REFERENCE TO RELATED APPLICATION

This application claims the priority of Korean patent application Ser. No. 99-55681 filed on Dec. 8, 1999.

BACKGROUND OF THE INVENTION

1. Field of the Invention

The present invention relates to a method for fabricating a semiconductor device including stacked capacitors, and more particularly to a method for fabricating a semiconductor device including stacked capacitors, in which dummy plate electrodes and charge storage electrodes are formed at a region other than a memory cell region, to control a topology resulting from capacitors, thereby allowing fine interconnection lines to be formed after the formation of those capacitors.

2. Description of the Related Art

As well known, the recent trend to fabricate a semiconductor device with a high degree of integration inevitably results in a reduced cell size. In order to obtain a desired capacitance in the reduced cell size, such a semiconductor device tends to have a stacked capacitor structure having an increased stack height. Such a semiconductor device also tends to have a highly integrated logic circuit arranged around a memory cell region thereof in order to obtain a high performance. For such a highly integrated logic circuit, it is necessary to use interconnection lines of an increased fineness. This also results in an increase in the stack height of capacitors.

Due to such an increased stack height resulting from the manufacture of a semiconductor device with a high integration and high performance, there is a severe topology between a memory cell region formed with capacitors and a logic circuit region around the memory cell region, as shown in FIG. 1. In FIG. 1, the reference character "A" denotes the logic circuit region, and the reference character "B" denotes the memory cell region.

FIG. 1 is a cross-sectional view illustrating a semiconductor device including stacked capacitors formed in accordance with a conventional method. A semiconductor substrate 1 is first prepared, which is formed with a desired logic circuit in a logic circuit region A, and a plurality of transistors, respectively adapted to drive capacitors to be subsequently formed, in a memory cell region B, as shown in FIG. 1. A nitride or other material is then laminated over the upper surface of the semiconductor substrate 1, thereby forming a first etch barrier film 11. An oxide is subsequently formed over the first etch barrier film (not shown). The oxide film is then planarized to form a first interlayer insulating film 21. The reference numeral "1" denotes wells of a first conductivity type, for example, an n-type, "2" wells of a second conductivity type, for example, a p-type, "3" an element isolation insulating film, "4" diffusion regions adapted to be used as source electrodes 4a or drain electrodes 4b, "5" a gate oxide film, "6" gate electrodes, and "7" a first intermediate insulating film.

The first interlayer insulating film 21 and first etch barrier film 11 are then partially removed from the memory cell region B, thereby forming first contact holes through which drain electrodes 4b formed in the memory cell region B are exposed, respectively. Thereafter, a conductive material such as polysilicon is completely filled in the first contact holes. The conductive material remaining on the first interlayer insulating film 21 is then removed using an etchback process. Thus, first contact plugs 31 are formed. The first contact plugs 31, which are arranged at the outermost portion of the memory cell region B adjacent to the logic circuit region A, are dummy plugs. These contact plugs 31, that is, the dummy plugs, will be electrically connected to dummy charge storage electrodes in a subsequent processing step, respectively. Source electrodes 4a formed in the memory cell region B may also be exposed when the drain electrodes 4b are exposed, in order to form contact plugs on those source electrodes 4a. In this case, bit line contacts may be subsequently formed on the contact plugs of the source electrodes 4a. Subsequently, an oxide or other appropriate material is then laminated over the entire upper surface of the resulting structure formed with the contact plugs 31, thereby forming a second interlayer insulating film 22.

Thereafter, the second interlayer insulating film 22, first interlayer insulating film 21, and first etch barrier film 11 are partially removed in a sequential fashion, thereby forming second contact holes through which the source electrodes 4a, in the memory cell region B, to be connected with bit lines in a subsequent processing step, active regions 4 defined in the logic circuit region A to be connected with first interconnection lines, and gate electrodes are exposed. In the case in which contact plugs are also formed on the source electrodes 4a at the processing step of FIG. 1, the second contact holes associated with the bit lines are formed on those contact plugs.

Thereafter, a conductive material is formed over the resulting structure to form a first conductive layer 41 covering the upper surface of the second interlayer insulating film 22 while completely filling the second contact holes. An insulating material is then laminated over the first conductive layer 41, thereby forming a second intermediate insulating film 25. This first conductive layer 41 will be subsequently patterned so that it is used as interconnection lines in the logic circuit region A while being used as bit lines in the memory cell region B. The second intermediate insulating film 25, first conductive layer 41, second interlayer insulating film 22 are then patterned to form first interconnection lines 41a and bit lines 41b. In accordance with the pattering of the second intermediate insulating film 22 at this processing step, respective upper surfaces of the first contact plugs 31 may be exposed. Alternatively, the second interlayer insulating film 22 may be partially left in a small thickness.

A nitride film or other appropriate material film is subsequently laminated over the entire upper surface of the resulting structure, in which the first contact plugs 31 are exposed, thereby forming a second etch barrier film 12. An oxide film is then laminated over the second etch barrier film 12. Then, the oxide film is planarized using a CMP process, thereby forming a third interlayer insulating film 23.

Thereafter, contacts are then formed at the first contact plugs 31 respectively disposed on the drain electrodes 4b to which capacitors are to be connected. The formation of the contacts is achieved by etching the second etch barrier film 12 using a contact mask as an etch barrier, etching the third interlayer insulating film 23 using the contact mask and second etch barrier film 12 as an etch mask, and then etching the second etch barrier film 12. Thereafter, a charge storage electrode material is formed over the upper surface of the resulting structure.

The charge storage electrode material is then patterned using a charge storage electrode mask, thereby forming charge storage electrodes 42. Thereafter, the formation of a capacitor dielectric film 45 and a conductive layer 47 adapted to form plate electrodes is carried out.

Thereafter, a fourth interlayer insulating film 49 is formed on the resulting structure.

As shown in FIG. 1, in the semiconductor device, a step is defined between the memory cell region B formed with capacitors and the logic circuit region A formed with a logic circuit due to an increased stack height of the capacitor structure. Due to such a step or topology, it is impossible to form an accurate pattern in the logic circuit region A or memory cell region B. This is because when a particular layer formed on the capacitor structure is patterned in accordance with a photolithography process, there is a focus depth difference between exposure light onto the logic circuit region A and exposure light onto the memory cell region B. As a result, it is very difficult to form fine metal lines.

SUMMARY OF THE INVENTION

The present invention has been made in view of the above mentioned problems, and an object of the invention is to provide a method for fabricating a semiconductor device, in which dummy plate electrodes and charge storage electrodes are formed at a logic circuit region in the procedure for forming capacitors, thereby preventing the formation of a step between a logic circuit region and a memory cell region, and thus, allowing a formation of fine interconnection lines.

In accordance with the present invention, this object is accomplished by providing A method for fabricating a semiconductor device including a plurality of stacked capacitors on a semiconductor substrate having a logic circuit region and a memory cell region, wherein dummy plate electrodes and charge storage electrodes, each of which has the same height as that of the stacked capacitor, are formed at the logic circuit region when the stacked capacitor are formed at the memory cell region.

Preferably, this method comprises the steps of forming gate electrodes, source electrodes, and drain electrodes on the semiconductor substrate, and forming a first interlayer insulating film in a planarized fashion over an upper surface of a structure resulting from the formation of the electrodes, forming, on the first interlayer insulating film at the memory cell region, bit lines connected to the source electrodes while forming, on the first interlayer insulating film at the logic circuit region, first interconnection lines connected to the source, drain, and gate electrodes, and forming a second interlayer insulating film in a planarized fashion over an upper surface of a structure resulting from the formation of the bit lines and the first interconnection lines, forming contact holes at the first interconnection lines in the logic circuit region, forming a conductive material in a planarized fashion over an upper surface of a structure resulting from the formation of the contact holes, and etching back the conductive material, thereby forming contact plugs respectively connected to the first interconnection lines, forming an etch barrier film over an upper surface of a structure resulting from the formation of the contact plugs, forming contact holes exposing the drain electrodes, and forming a conductive material, adapted to form charge storage electrodes, over an upper surface of a structure resulting from the formation of the contact holes exposing the drain electrodes, patterning the charge storage electrode conductive material using a charge storage electrode mask, thereby forming the charge storage electrodes and the dummy charge storage electrodes, forming a capacitor dielectric film over an upper surface of a structure resulting from the formation of the charge storage electrodes and the dummy charge storage electrodes, and forming, over the capacitor dielectric film, a conductive material adapted to form plate electrodes, patterning the plate electrode conductive material using a plate electrode mask, thereby forming plate electrodes and dummy plate electrodes, and forming a third interlayer insulating film in a planarized fashion over an upper surface of a structure resulting from the formation of the plate electrodes and dummy plate electrodes, and forming second interconnection lines connected to the contact plugs formed at the first interconnection lines.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Figure 1:
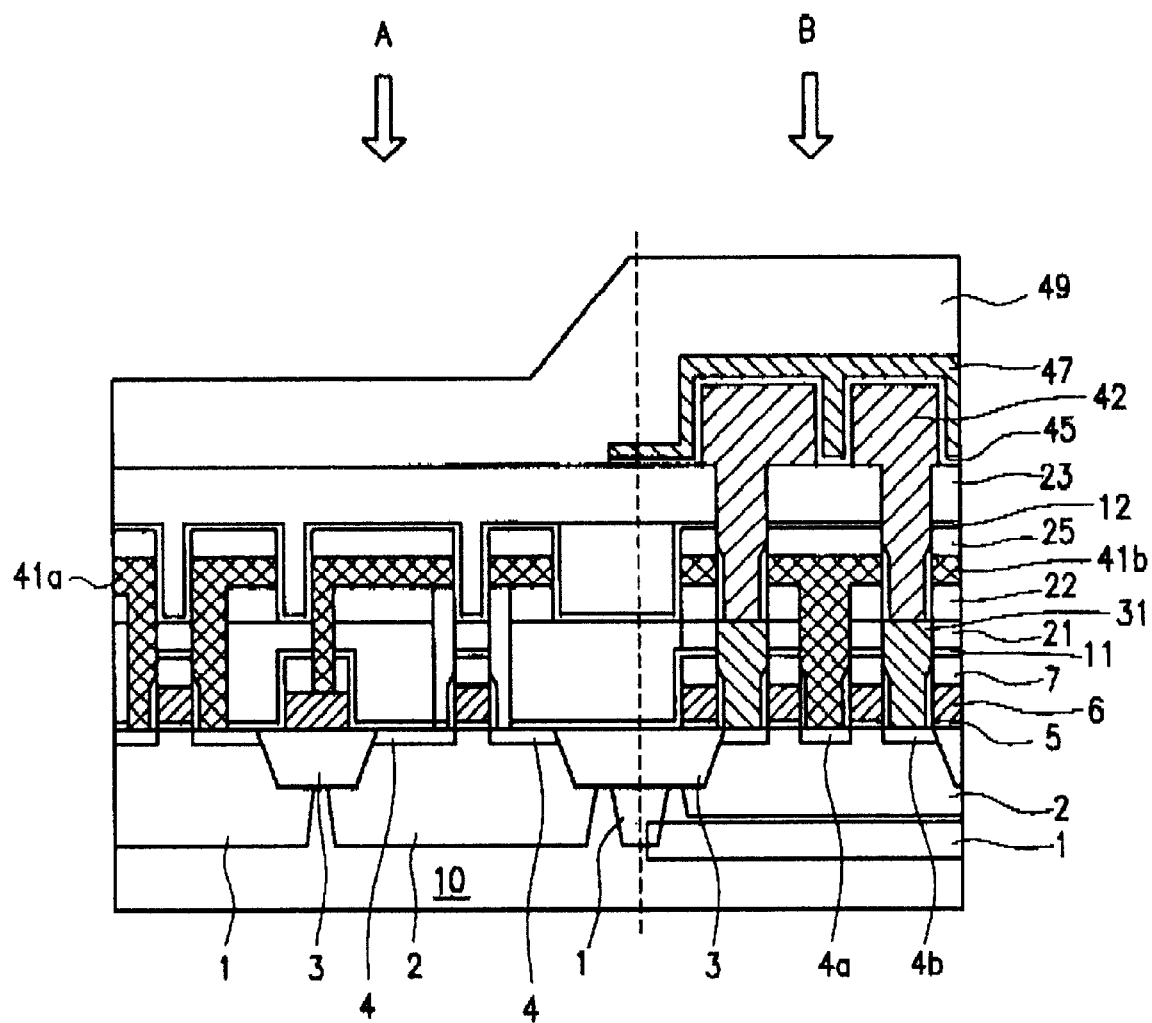
FIG. 1 is a cross-sectional view illustrating a semiconductor device including stacked capacitors fabricated in accordance with a conventional method.

Now, preferred embodiments of the present invention will be described in detail, in conjunction with the annexed drawings.

The important technical idea of the present invention is to avoid a severe topology from being formed between a memory cell region and a logic circuit region around the memory cell region due to an increased stack height of stacked capacitors, thereby achieving a fineness of interconnection lines. This technical idea realizes by forming dummy plate electrodes and charge storage electrodes at the logic circuit region during the formation of capacitors in the memory cell region.

For an easy and best understanding of the present invention, layers having the same function are denoted by the same reference numeral. For forming and patterning processes for each layer, those are typically used in the manufacture of semiconductor devices. Accordingly, no description will be made in conjunction with those processes.

FIGS. 2a to 2h are cross-sectional views respectively illustrating sequential processing steps of a method for fabricating a semiconductor device including stacked capacitors in accordance with a preferred embodiment of the present invention.

Figure 2A:
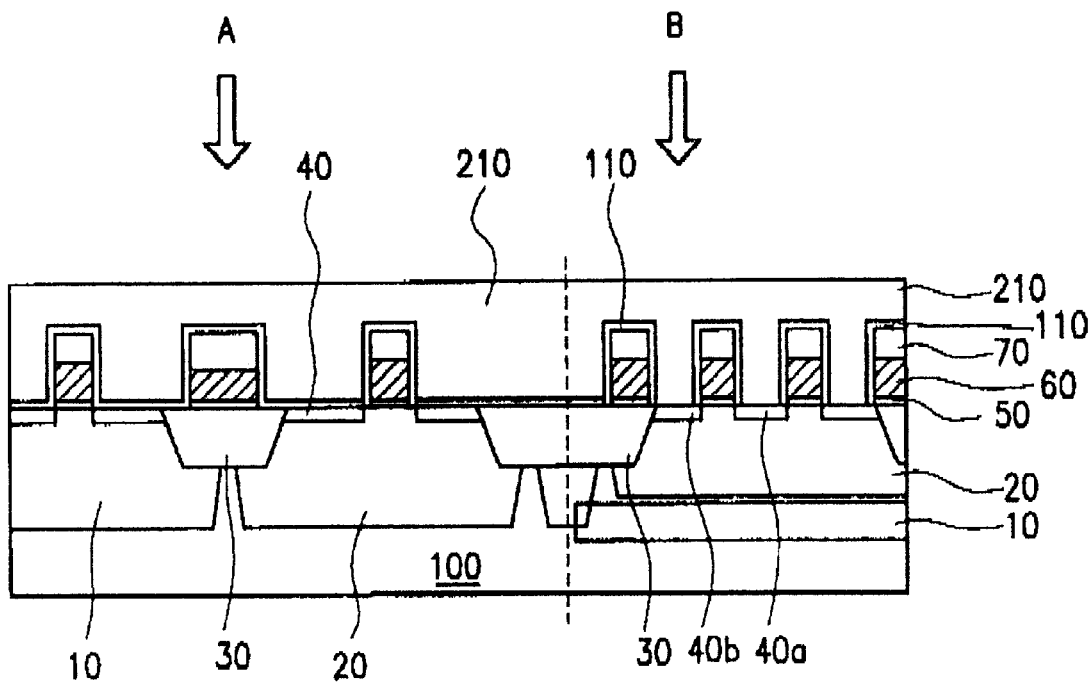
FIGS. 2a to 2h are cross-sectional views respectively illustrating sequential processing steps of a method for fabricating a semiconductor device including stacked capacitors in accordance with a preferred embodiment of the present invention.

In accordance with this embodiment, a semiconductor substrate 100 is first prepared, which is formed with a desired logic circuit in a logic circuit region A, and a plurality of transistors, respectively adapted to drive capacitors to be subsequently formed, in a memory cell region B, as shown in FIG. 2a. A nitride or other material is then laminated over the upper surface of the semiconductor substrate 100, thereby forming a first etch barrier film 110. An oxide is subsequently formed over the first etch barrier film 110. The oxide film is then planarized to form a first interlayer insulating film 210. In FIG. 2a, the reference numeral "10" denotes wells of a first conductivity type, for example, an n-type, "20" wells of a second conductivity type, for example, a p-type, "30" an element isolation insulating film, "40" diffusion regions adapted to be used as source electrodes 40a or drain electrodes 40b, "50" a gate oxide film, "60" gate electrodes, and "70" a first intermediate insulating film.

Figure 2B:
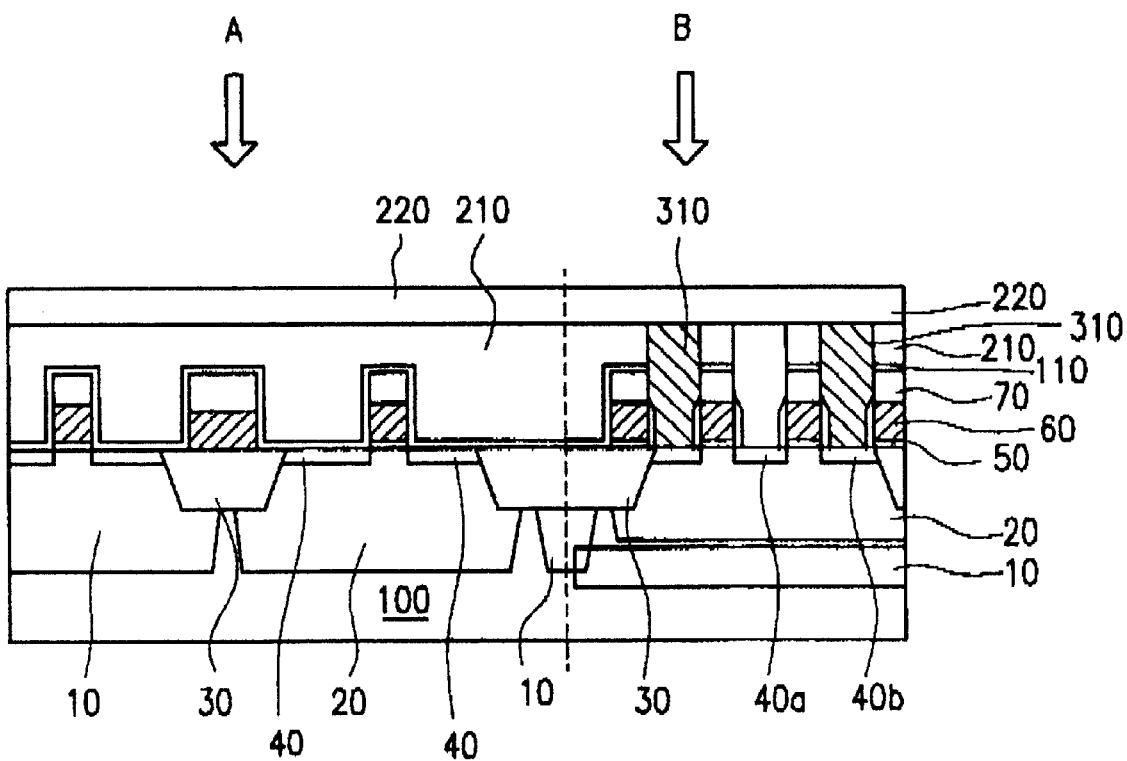

Referring to FIG. 2b, the first interlayer insulating film 210 and first etch barrier film 110 are then partially removed from the memory cell region B, thereby forming first contact holes through which drain electrodes 40b formed in the memory cell region B are exposed, respectively. Thereafter, a conductive material such as polysilicon is completely filled in the first contact holes. The conductive material remaining on the first interlayer insulating film 210 is then removed using an etchback process. Thus, first contact plugs 310 are formed. The first contact plugs 310, which are arranged at the outermost portion of the memory cell region B adjacent to the logic circuit region A, are dummy plugs. These contact plugs 310, that is, the dummy plugs, will be electrically connected to dummy charge storage electrodes in a subsequent processing step, respectively. Source electrodes 40a formed in the memory cell region B may also be exposed when the drain electrodes 40b are exposed, in order to form contact plugs on those source electrodes 40a. In this case, bit line contacts may be subsequently formed on the contact plugs of the source electrodes 40a. Subsequently, an oxide or other appropriate material is then laminated over the entire upper surface of the resulting structure formed with the contact plugs 310, thereby forming a second interlayer insulating film 220.

Figure 2C:
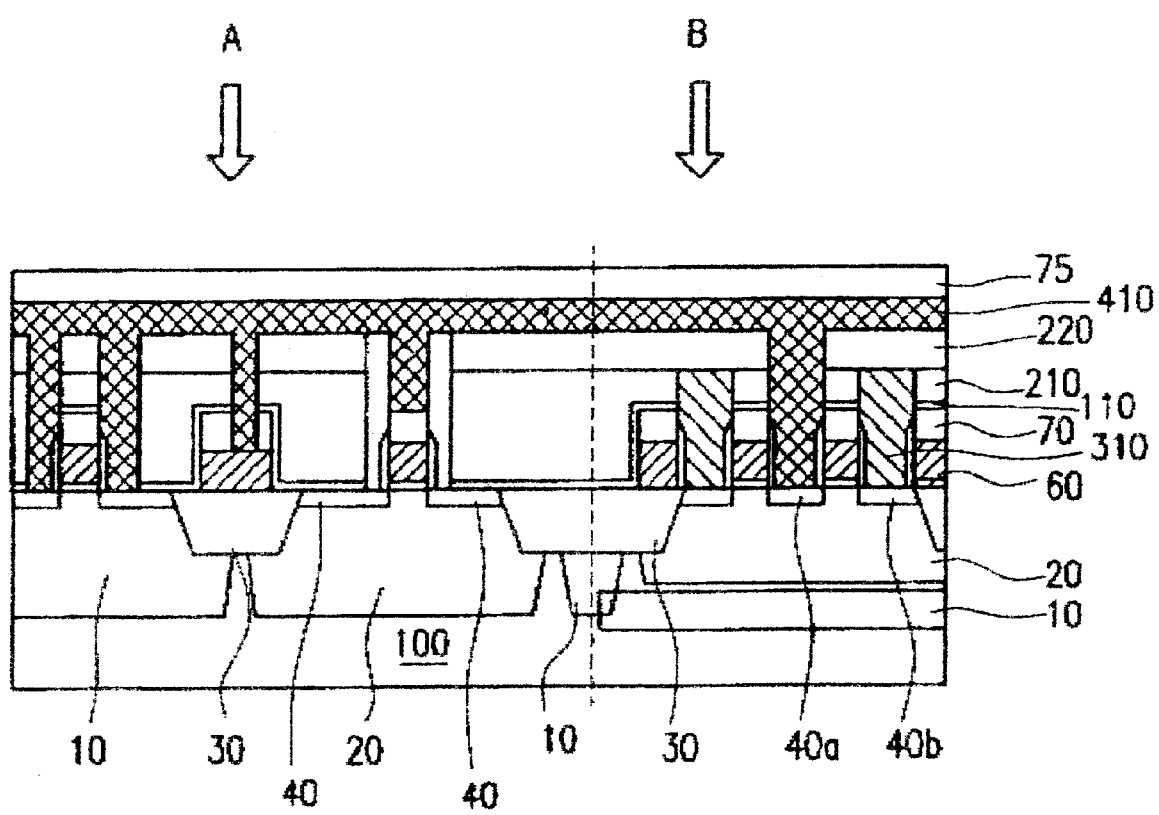

Referring to FIG. 2c, the second interlayer insulating film 220, first interlayer insulating film 210, and first etch barrier film 110 are partially removed in a sequential fashion, thereby forming second contact holes through which the source electrodes 40a, in the memory cell region B, to be connected with bit lines in a subsequent processing step, active regions 40 defined in the logic circuit region A to be connected with first interconnection lines, and gate electrodes are exposed. In the case in which contact plugs are also formed on the source electrodes 40a at the processing step of FIG. 2b, the second contact holes associated with the bit lines are formed on those contact plugs.

Thereafter, a conductive material is formed over the resulting structure to form a first conductive layer 410 covering the upper surface of the second interlayer insulating film 220 while completely filling the second contact holes. An insulating material is then laminated over the first conductive layer 410, thereby forming a second intermediate insulating film 75. This first conductive layer 410 will be subsequently patterned so that it is used as interconnection lines in the logic circuit region A while being used as bit lines in the memory cell region B.

Figure 2D:
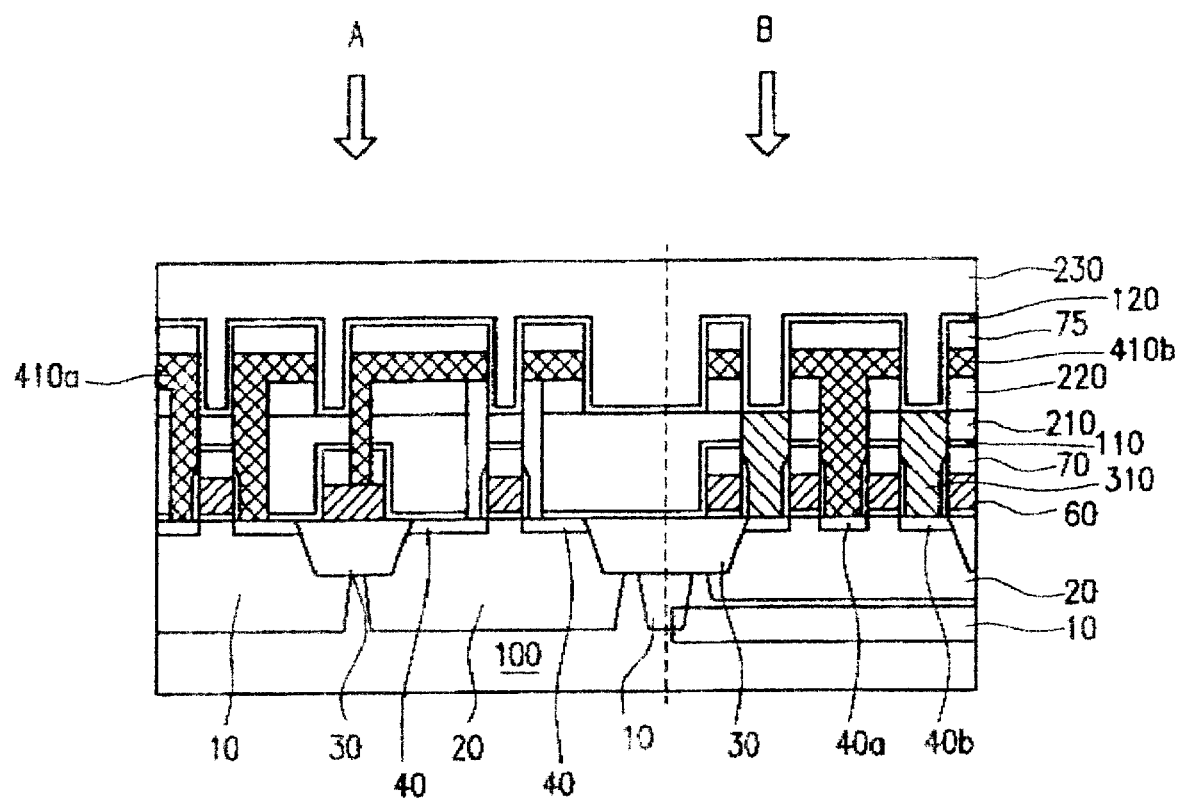

Referring to FIG. 2d, the second intermediate insulating film 75, first conductive layer 410, second interlayer insulating film 220 are then patterned to form first interconnection lines 410a and bit lines 410b. In accordance with the pattering of the second intermediate insulating film 220 at this processing step, respective upper surfaces of the first contact plugs 310 may be exposed. Alternatively, the second interlayer insulating film 220 may be partially left in a small thickness.

A nitride film or other appropriate material film is subsequently laminated over the entire upper surface of the resulting structure, in which the first contact plugs 310 are exposed, thereby forming a second etch barrier film 120. An oxide film is then laminated over the second etch barrier film 120. Then, the oxide film is planarized using a CMP process, thereby forming a third interlayer insulating film 230.

Figure 2E:
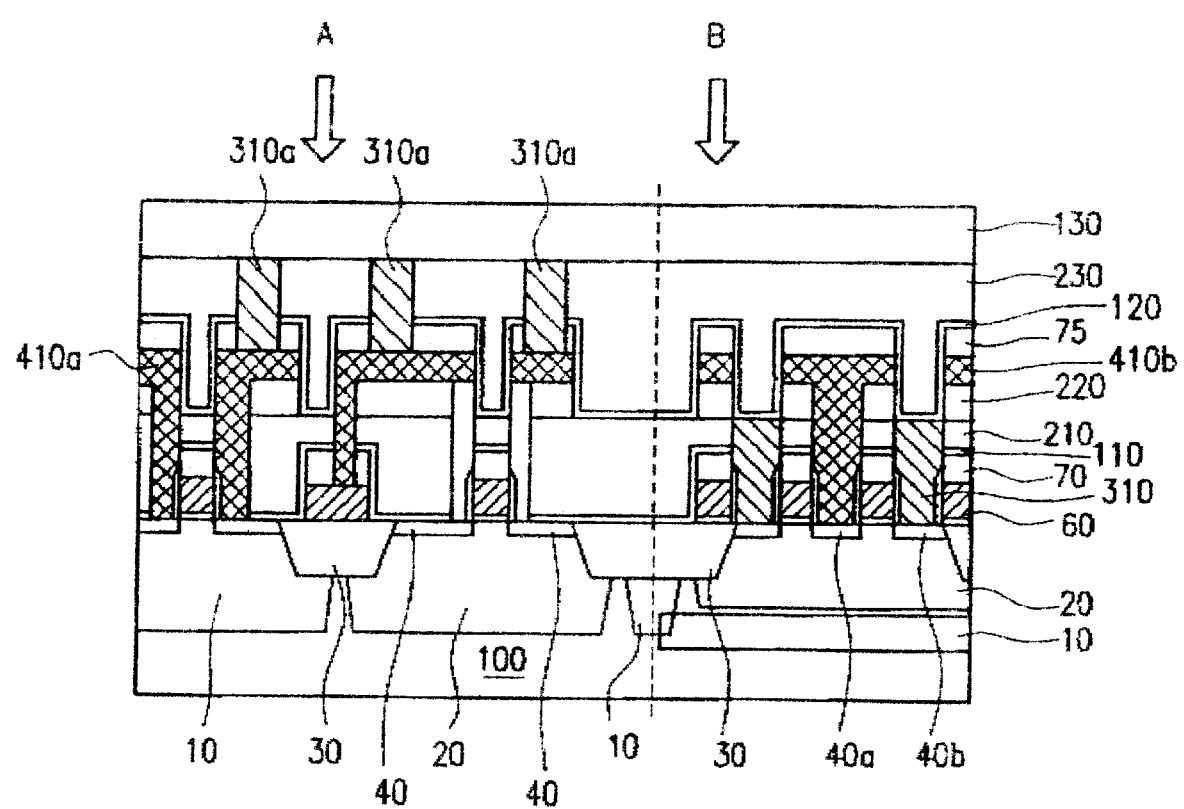

Referring to FIG. 2e, contact holes are then formed at the first interconnection lines 410a in the logic circuit region A. Over the upper surface of the resulting structure, a conductive material is subsequently formed to a desired thickness so as to provide a planarized upper surface. This conductive material layer is then etched back, thereby forming second contact plugs 310a connected to the first interconnection lines 410a. Thereafter, a third etch barrier film 130 is formed over the upper surface of the resulting structure. Preferably, the third etch barrier film 130 has a multilayered Ti/TiN/W (Titanium/Titanium Nitride/Tungsten) structure. The etchback process of the conductive material layer may be achieved using etching gas or a CMP process. The third etch barrier film 130 serves to prevent the second contact plug from being damaged during a subsequent processing step of forming capacitors.

Figure 2F:
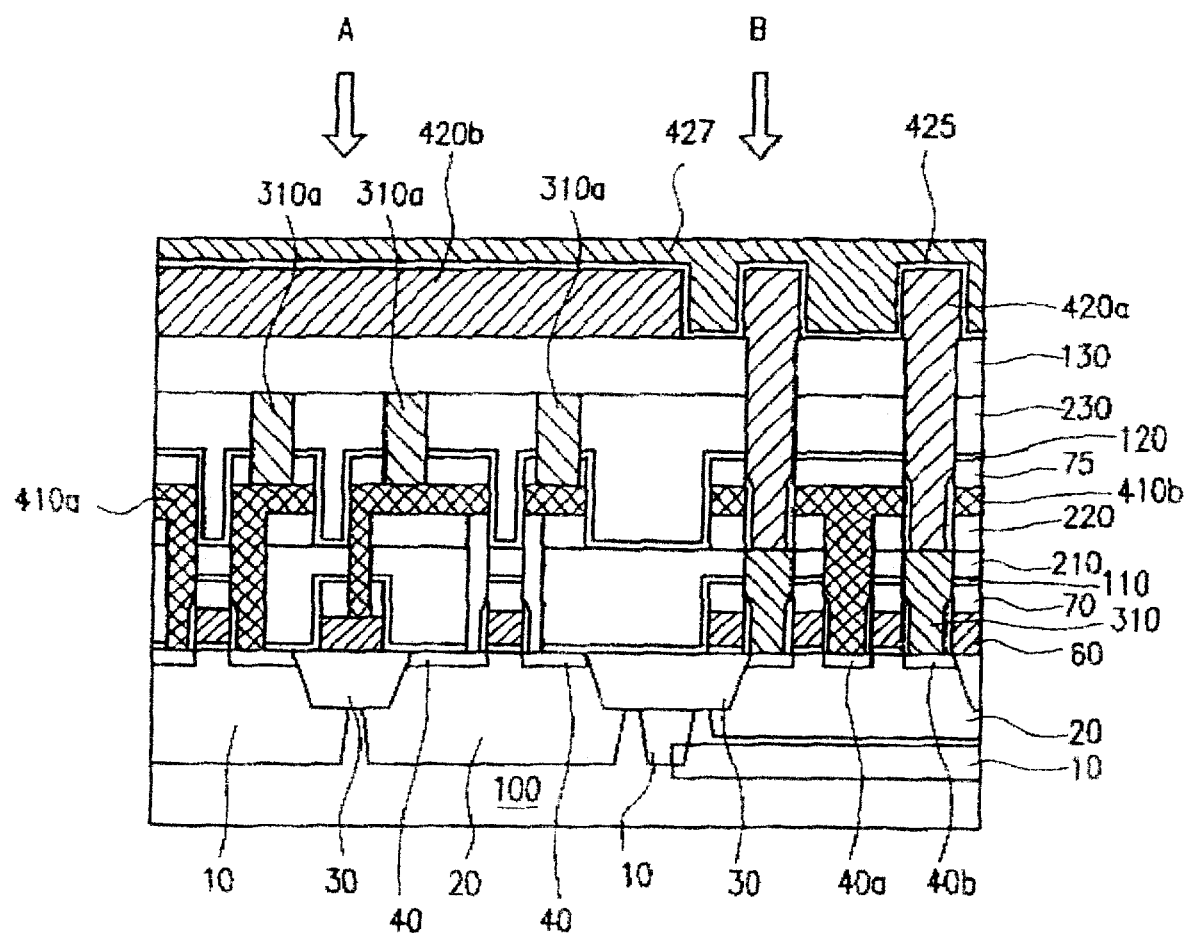

Referring to FIG. 2f, contacts are then formed at the first contact plugs 310 respectively disposed on the drain electrodes 40a to which capacitors are to be connected. The formation of the contacts is achieved by etching the third etch barrier film 130 using a contact mask as an etch barrier, etching the third interlayer insulating film 230 using the contact mask and second etch barrier film 120 as an etch mask, and then etching the second etch barrier film 120. Thereafter, a charge storage electrode material is formed over the upper surface of the resulting structure.

The charge storage electrode material is then patterned using a charge storage electrode mask, thereby forming charge storage electrodes 420a and dummy charge storage electrodes 420b. The charge storage electrodes 420a are formed in such a fashion that one charge storage electrode is provided for each memory cell in the memory cell region B, and that they are separated from one another. On the other hand, the dummy charge storage electrodes 420b are formed at a desired portion in the logic circuit region A. Thereafter, the formation of a capacitor dielectric film 425 and a conductive layer 427 adapted to form plate electrodes is carried out.

The charge storage electrodes 420a and plate electrode conductive layer 427 may be made of silicon. Prior to the formation of the capacitor dielectric film 425, the charge storage electrodes 420a may be subjected to a surface treatment so that it has a hemispherical grain structure at its upper surface.

Where the capacitor dielectric film 425 is made of a ferroelectric, the charge storage electrodes 420a and plate electrode conductive layer 427 may be made of platinum.

Figure 2G:
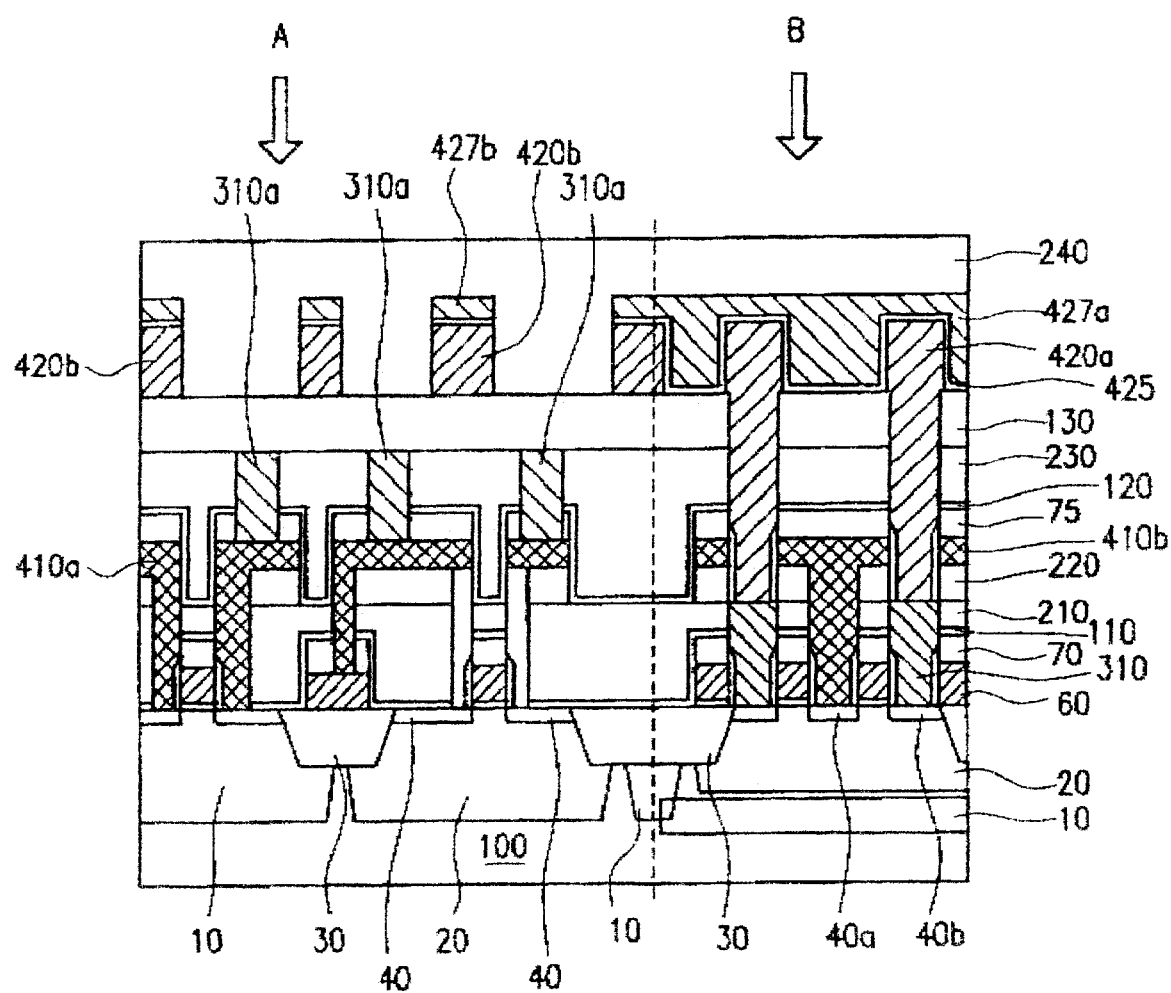

Referring to FIG. 2g, the plate electrode conductive layer 427 is then patterned in accordance with an etching process using a plate electrode mask (not shown), thereby forming plate electrodes 427a and dummy plate electrodes 427b. The plate electrodes 427a are disposed throughout the memory cell region B whereas the dummy plate electrodes 427b are disposed at portions of the logic circuit region A each defined between neighboring second contact plugs 310a while having a width smaller than that of those region portions. The etching of the dielectric film 425 and charge storage electrode conductive layer 427a may be carried out in the procedure of etching the plate electrode conductive layer 427a. Thereafter, a fourth interlayer insulating film 240 is formed over the resulting structure in a planarized fashion.

The fourth interlayer insulating film 240 may be made of an oxide film. The planarization of the fourth interlayer insulating film 240 may be achieved by depositing an insulating film to a desired thickness, and then carrying out the insulating film a CMP process.

Figure 2H:
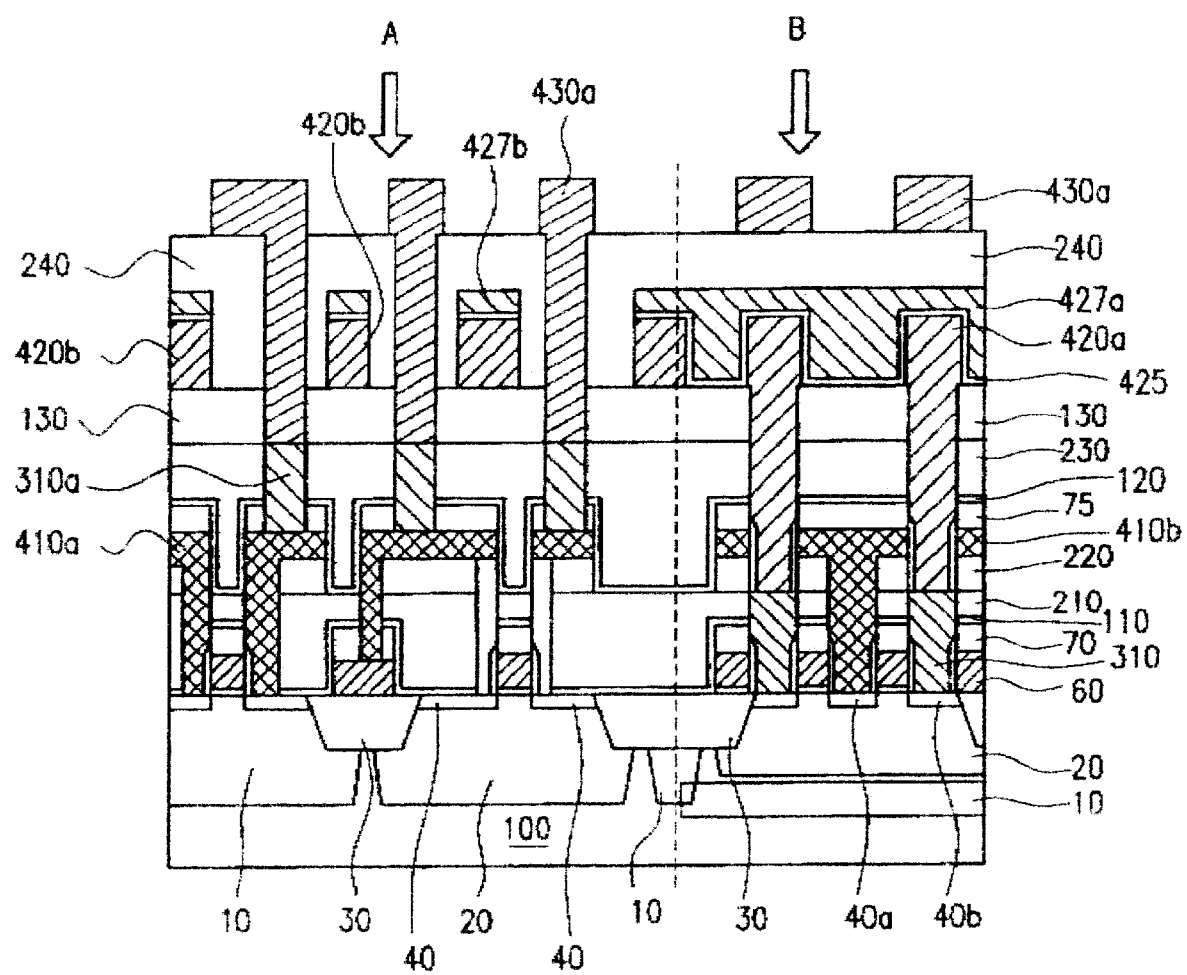

Referring to FIG. 2h, contacts are then formed at the second contact plugs 310a formed on the first interconnection lines 410a. The formation of the contacts may be achieved by etching the fourth interlayer insulating film 240 using a contact mask and the third etch barrier film 130 as an etch barrier, and then etching the third etch barrier film 130. Thereafter, second interconnection lines 430a are formed.

The formation of the second interconnection lines 430a is achieved by depositing a conductive material over the upper surface of the structure obtained after the formation of the contacts at the second contact plugs 310a, and etching the conductive material using a second connection interconnection mask. Alternatively, the second interconnection lines 430a may be formed in accordance with another method. In this case, the fourth interlayer insulating film 240 is formed to have a thickness increased by the thickness of the second interconnection lines 430a. After the formation of the contacts at the second contact plugs 310a, the fourth interlayer insulating film 240 is etched up to a desired depth at regions where the second interconnection lines 430a are to be arranged, thereby forming contact grooves. A conductive material is then deposited to bury the contact grooves. The conductive material is subsequently etched back to form the second interconnection lines 430a.

As apparent from the above description, the present invention provides a method for fabricating a semiconductor device including stacked capacitors, in which dummy plate electrodes and dummy charge storage electrodes are formed at a region other than a memory cell region, to control a topology resulting from capacitors, thereby allowing fine interconnection lines to be formed.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device including a plurality of stacked capacitors on a semiconductor substrate having a logic circuit region and a memory cell region, comprising the steps of:

(a) forming gate electrodes, source electrodes, and drain electrodes on a semiconductor substrate, and forming a first interlayer insulating film in a planarized fashion over an upper surface of a structure resulting from the formation of the electrodes;

(b) forming, on the first interlayer insulating film at the memory cell region, bit lines connected to the source electrodes while forming, on the first interlayer insulating film at the logic circuit region, first interconnection lines connected to the source, drain, and gate electrodes, and forming a second interlayer insulating film in a planarized fashion over an upper surface of a structure resulting from the formation of the bit lines and the first interconnection lines;

(c) forming contact holes at the first interconnection lines in the logic circuit region, forming a conductive material in a planarized fashion over an upper surface of a structure resulting from the formation of the contact holes, and etching back the conductive material, thereby forming contact plugs respectively connected to the first interconnection lines;

(d) forming an etch barrier film over an upper surface of a structure resulting from the formation of the contact plugs, forming contact holes exposing the drain electrodes, and forming a conductive material, adapted to form charge storage electrodes, over an upper surface of a structure resulting from the formation of the contact holes exposing the drain electrodes;

(e) patterning the conductive material adapted to form the charge storage electrodes using a charge storage electrode mask to form the charge storage electrodes and dummy charge storage electrodes, forming a capacitor dielectric film over an upper surface of a structure resulting from formation of the charge storage electrodes and the dummy charge storage electrodes, and forming, over the capacitor dielectric film, a conductive material adapted to form plate electrodes;

(f) patterning the conductive material adapted to form the plate electrodes using a plate electrode mask, thereby forming plate electrodes and dummy plate electrodes, and forming a third interlayer insulating film in a planarized fashion over an upper surface of a structure resulting from the formation of the plate electrodes and dummy plate electrodes; and (g) forming second interconnection lines connected to the contact plugs formed at the first interconnection lines, wherein the dummy plate electrodes and the dummy charge storage electrodes each have a height which is the same as that of the stacked capacitors, and are formed at the logic circuit region when the stacked capacitors are formed at the memory cell region.

2. The method according to claim 1, wherein the charge storage electrodes formed at the step (e) are arranged so that one charge storage electrode is provided for each of memory cells in the memory cell region while being separated from the remaining charge storage electrodes provided for the remaining memory cells, and the dummy charge storage electrodes are arranged at a desired portion in the logic circuit region.

3. The method according to claim 1, wherein the plate electrodes formed at the step (f) are arranged throughout the memory cell region, and the dummy plate electrodes are arranged at portions of the logic circuit region each defined between neighboring ones of the contact plugs, formed at the first interconnection line, while having a width smaller than that of the region portions, respectively.

4. The method according to claim 1, further comprising, for the connection of the drain electrodes to the capacitors, the steps of:

(i) forming a first intermediate insulating film over the upper surface of the structure resulting from the formation of the electrodes, forming a first etch barrier film over the first intermediate insulating film, and forming the first interlayer insulating film in a planarized fashion over the intermediate insulating film;

(ii) etching the first interlayer insulating film using a contact mask, along with the first etch barrier film, as an etch barrier, partially etching the first etch barrier film, thereby forming contact holes at the drain electrodes to be connected to the capacitors in the memory cell region, depositing a conductive material to bury the contact holes, and etching back the conductive material, thereby forming contact plugs respectively connected to the drain electrodes;

(iii) forming the second interlayer insulating film over an upper surface of a structure resulting from the formation of the contact plugs connected to the drain electrodes, forming, at the second interlayer insulating film, contact holes electrically connected to the source electrodes, and sequentially forming a conductive material and a second intermediate insulating film over an upper surface of a structure resulting from the formation of the contact holes electrically connected to the source electrodes;

(iv) etching the second intermediate insulating film and the conductive material disposed beneath the second intermediate insulating film, using a photolithograpy process, etching the second interlayer insulating film to expose the contact plugs connected to the drain electrodes, forming a second etch barrier film over an upper surface of a structure resulting from the etching of the second interlayer insulating film; and forming the third interlayer insulating film in a planarized fashion over the second etch barrier film; and (v) etching the third interlayer insulating film using the contact mask, along with the second etch barrier film, as an etch barrier, and etching the second etch barrier film, thereby forming contact holes respectively contacting the contact plugs connected to the drain electrodes.

5. The method according to claim 1, wherein each of the interlayer insulating films is made of an oxide film, and each of the etch barrier films is made of a nitride film.

6. The method according to claim 4, wherein each of the interlayer insulating films is made of an oxide film, and each of the etch barrier films is made of a nitride film.

7. The method according to claim 1, further comprising, for the connection of the bit lines to the source drain electrodes, the steps of:

(i) forming a first intermediate insulating film over the upper surface of the structure resulting from the formation of the electrodes, forming a first etch barrier film over the first intermediate insulating film, and forming the first interlayer insulating film in a planarized fashion over the intermediate insulating film;

(ii) etching the first interlayer insulating film using a contact mask, along with the first etch barrier film, as an etch barrier, partially etching the first etch barrier film, thereby forming contact holes at the drain electrodes to be connected to the capacitors in the memory cell region, depositing a conductive material to bury the contact holes, and etching back the conductive material, thereby forming contact plugs respectively connected to the drain electrodes; and (iii) forming the second interlayer insulating film over an upper surface of a structure resulting from the formation of the contact plugs connected to the drain electrodes, etching the first and second interlayer insulating film using a contact mask, along with the first etch barrier film, as an etch barrier, and etching the first etch barrier film, thereby forming contact holes contacting the source electrodes to be connected to the bit lines.

* * * * *